(12) United States Patent
Sewell

(10) Patent No.: US 7,898,643 B2
(45) Date of Patent: *Mar. 1, 2011

(54) IMMERSION PHOTOLITHOGRAPHY SYSTEM AND METHOD USING INVERTED WAFER-PROJECTION OPTICS INTERFACE

(75) Inventor: Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 998 days.

This patent is subject to a terminal disclaimer.

(21) Appl. No.: 11/187,010

(22) Filed: Jul. 22, 2005

(65) Prior Publication Data

US 2005/0254031 A1    Nov. 17, 2005

Related U.S. Application Data

(63) Continuation of application No. 10/831,300, filed on Apr. 26, 2004, now Pat. No. 6,980,277, which is a continuation of application No. 10/607,170, filed on Jun. 27, 2003, now Pat. No. 6,809,794.

(51) Int. Cl.
*G03B 27/42* (2006.01)
(52) U.S. Cl. .......................................................... 355/53
(58) Field of Classification Search .................... 355/53, 355/72, 75, 30; 134/95.2
See application file for complete search history.

(56) References Cited

U.S. PATENT DOCUMENTS

| | | | |
|---|---|---|---|
| 2,230,654 A * | 2/1941 | Plunkett ........................ | 526/255 |
| 3,243,321 A * | 3/1966 | Rowand ........................ | 148/272 |
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,405,701 A | 9/1983 | Banks et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,059,287 A * | 10/1991 | Harkey, Sr. ........................ | 203/1 |
| 5,610,683 A | 3/1997 | Takahashi | |
| 5,691,802 A | 11/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |

(Continued)

FOREIGN PATENT DOCUMENTS

DE                206607                2/1984

(Continued)

OTHER PUBLICATIONS

Machine translation of WO 99/49504 from <http://dossier.ipdl.inpit.go.jp/text_trans.html>, pertinant pp. 4, 9, 11, 17 and 18.*

(Continued)

*Primary Examiner* — Hung Henry Nguyen
*Assistant Examiner* — Steven H Whitesell-Gordon
(74) *Attorney, Agent, or Firm* — Pillsbury Winthrop Shaw Pittman LLP

(57) ABSTRACT

A liquid immersion photolithography system includes an exposure system that exposes a substrate with electromagnetic radiation, and also includes an optical system that images the electromagnetic radiation on the substrate. A liquid is between the optical system and the substrate. The projection optical system is positioned below the substrate.

18 Claims, 2 Drawing Sheets

U.S. PATENT DOCUMENTS

| | | |
|---|---|---|
| 6,236,634 B1 | 5/2001 | Lee et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,649,093 B2 | 11/2003 | Van Santen et al. |
| 6,781,670 B2 | 8/2004 | Krautschik |
| 6,788,477 B2 | 9/2004 | Lin |
| 6,809,794 B1 | 10/2004 | Sewell |
| 6,844,206 B1 | 1/2005 | Phan et al. |
| 6,844,919 B2 | 1/2005 | Suenaga |
| 6,980,277 B2 | 12/2005 | Sewell |
| 7,012,673 B2 | 3/2006 | Kolesnychenko et al. |
| 7,069,937 B2 * | 7/2006 | Garcia et al. .................. 134/199 |
| 7,198,055 B2 * | 4/2007 | Woods et al. ................ 134/95.2 |
| 7,234,477 B2 * | 6/2007 | de Larios et al. ........... 134/95.2 |
| 7,252,097 B2 * | 8/2007 | Boyd et al. .................. 134/57 R |
| 7,367,345 B1 | 5/2008 | Hemker |
| 2002/0008862 A1 | 1/2002 | Kobayashi |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2003/0197848 A1* | 10/2003 | Shiraishi ......................... 355/67 |
| 2004/0000627 A1 | 1/2004 | Schuster |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0207824 A1 | 10/2004 | Lof et al. |
| 2004/0211920 A1 | 10/2004 | Maria Derksen et al. |
| 2004/0233405 A1 | 11/2004 | Kato et al. |
| 2004/0239954 A1 | 12/2004 | Bischoff |
| 2004/0257544 A1 | 12/2004 | Vogel et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1 | 1/2005 | Streefkerk et al. |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0018208 A1 | 1/2005 | Levinson |
| 2005/0024609 A1 | 2/2005 | De Smit et al. |
| 2005/0030498 A1 | 2/2005 | Mulkens |
| 2005/0030501 A1 | 2/2005 | Mulkens et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0078286 A1 | 4/2005 | Dierichs et al. |
| 2005/0078287 A1 | 4/2005 | Sengers et al. |
| 2005/0175776 A1 | 8/2005 | Streefkerk et al. |
| 2005/0231695 A1 | 10/2005 | Wang et al. |
| 2005/0237504 A1 | 10/2005 | Nagasaka et al. |
| 2006/0023188 A1 | 2/2006 | Hara |
| 2006/0033901 A1 | 2/2006 | Hara |
| 2006/0132736 A1 | 6/2006 | Nagasaka et al. |
| 2006/0146306 A1 | 7/2006 | Nagasaka et al. |
| 2007/0024832 A1 | 2/2007 | Owa |
| 2007/0064209 A1 | 3/2007 | Hara |

FOREIGN PATENT DOCUMENTS

| | | | |
|---|---|---|---|
| DE | 221563 | A1 | 4/1985 |
| DE | 224448 | A1 | 7/1985 |
| DE | 242880 | A1 | 2/1987 |
| EP | 0023231 | A1 | 2/1981 |
| EP | 0418427 | A2 | 3/1991 |
| EP | 1039511 | A1 | 9/2000 |
| EP | 1 612 850 | A1 | 1/2006 |
| FR | 2474708 | | 7/1981 |
| JP | 58-202448 | A | 11/1983 |
| JP | 62-065326 | A | 3/1987 |
| JP | 62-121417 | A | 6/1987 |
| JP | 63-157419 | A | 6/1988 |
| JP | 04-305915 | A | 10/1992 |
| JP | 04-305917 | A | 10/1992 |
| JP | 4305915 | | 10/1992 |
| JP | 05-060981 | | 3/1993 |
| JP | 06-124873 | A | 5/1994 |
| JP | 06-208058 | | 7/1994 |
| JP | 07-132262 | A | 5/1995 |
| JP | 07-220990 | A | 8/1995 |
| JP | 10-228661 | A | 8/1998 |
| JP | 10-255319 | A | 9/1998 |
| JP | 10255319 | A | 9/1998 |
| JP | 10-303114 | A | 11/1998 |
| JP | 10-340846 | A | 12/1998 |
| JP | 11-176727 | A | 7/1999 |
| JP | 2000-12453 | | 1/2000 |
| JP | 2000-058436 | A | 2/2000 |
| JP | 2001-091849 | A | 4/2001 |
| JP | 2004-193252 | A | 7/2004 |
| SU | 302685 | A | 6/1971 |
| WO | WO 99/49504 | A1 | 9/1999 |
| WO | WO 03/077036 | A1 | 9/2003 |
| WO | WO 03/077037 | A1 | 9/2003 |
| WO | WO 2004/019128 | A2 | 3/2004 |
| WO | WO 2004/053596 | A2 | 6/2004 |
| WO | WO 2004/053950 | A1 | 6/2004 |
| WO | WO 2004/053951 | A1 | 6/2004 |
| WO | WO 2004/053952 | A1 | 6/2004 |
| WO | WO 2004/053953 | A1 | 6/2004 |
| WO | WO 2004/053954 | A1 | 6/2004 |
| WO | WO 2004/053955 | A1 | 6/2004 |
| WO | WO 2004/053956 | A1 | 6/2004 |
| WO | WO 2004/053957 | A1 | 6/2004 |
| WO | WO 2004/053958 | A1 | 6/2004 |
| WO | WO 2004/053959 | A1 | 6/2004 |
| WO | WO 2004/055803 | A1 | 7/2004 |
| WO | WO 2004/057295 | A2 | 7/2004 |
| WO | WO 2004/057589 | A1 | 7/2004 |
| WO | WO 2004/086468 | A1 | 10/2004 |
| WO | WO 2004/086470 | A1 | 10/2004 |
| WO | WO 2004/090577 | A2 | 10/2004 |
| WO | WO 2004/090633 | A2 | 10/2004 |
| WO | WO 2004/090634 | A2 | 10/2004 |
| WO | WO 2004/090956 | A1 | 10/2004 |
| WO | WO 2004/092830 | A2 | 10/2004 |
| WO | WO 2004/092833 | A2 | 10/2004 |
| WO | WO 2004/093130 | A2 | 10/2004 |
| WO | WO 2004/093159 | A2 | 10/2004 |
| WO | WO 2004/093160 | A2 | 10/2004 |
| WO | WO 2004/095135 | A2 | 11/2004 |
| WO | WO 2004/097911 | A1 | 11/2004 |
| WO | WO 2004/102646 | A1 | 11/2004 |
| WO | WO 2004/105106 | A1 | 12/2004 |
| WO | WO 2004/105107 | A1 | 12/2004 |
| WO | WO 2004/107011 | A1 | 12/2004 |
| WO | WO 2004/107417 | A1 | 12/2004 |
| WO | WO 2004/112108 | A1 | 12/2004 |
| WO | WO 2004/114380 | A1 | 12/2004 |
| WO | WO 2005/006415 | | 1/2005 |
| WO | WO 2005/015315 | A2 | 2/2005 |
| WO | WO 2005/022616 | A1 | 3/2005 |
| WO | WO 2005/036623 | A1 | 4/2005 |
| WO | WO 2005/062351 | A1 | 7/2005 |

OTHER PUBLICATIONS

European Search Report for Application No. 04014393.5-2222 dated May 24, 2006, 4 pages.

English Language Abstract of Japanese Publication No. 2000012453, published Jan. 14, 2000, Patent Abstracts of Japan, 1 page.

English-language translation of a Japanese Office Action mailed Jun. 8, 2007, three (3) pages.

U.S. Appl. No. 10/367,910, filed Feb. 19, 2003, entitled "Projection exposure apparatus and method with workpiece area detection," to Kyoichi Suwa.

U.S. Appl. No. 11/122,215, filed May 5, 2005, entitled "Projection exposure apparatus and method with workpiece area detection," to Kyoichi Suwa.

"Depth-of-Focus Enhancement Using High Refractive Index Layer on the Imaging Layer", IBM Technical Disclosure Bulletin, vol. 27, No. 11, Apr. 1985, p. 6521.

Hata, H., "The Development of Immersion Exposure Tools", Litho Forum, International Sematech, Los Angeles, Jan. 27-29, 2004.

Hoffnagle, J.A. et al., "Liquid Immersion Deep-Ultraviolet Interferometric Lithography", J. Vac. Sci. Tech-not B., vol. 17, No. 6, Nov./Dec. 1999, pp. 3306-3309.

Hogan, H., "New Semiconductor Lithography Makes a Splash", Photonics Technology World, Photonics Spectra, Oct. 2003.

Kawata, H. et al., "Fabrication of 0.2μm Fine Patterns Using Optical Projection Lithography with an Oil Immersion Lens", Jpn. J. Appl. Phys. vol. 31 (1992), pp. 4174-4177.

Kawata, H. et al, "Optical Projection Lithography using Lenses with Numerical Apertures Greater than Unity", Microelectronic Engineering 9 (1989), pp. 31-36.

Lin, B.J., "Drivers, Prospects and Challenges for Immersion Lithography", TSMC, Inc., Sep. 2002.

Lin, B.J., "Proximity Printing Through Liquid", IBM Technical Disclosure Bulletin, vol. 20, No. 11B, Apr. 1978, p. 4997.

Lin, B.J., "The k3 Coefficient in Nonparaxial 1/NA Scaling Equations for Resolution, Depth of Focus, and Immersion Lithography," *Journal of Microlithography, Microfabrication, and Microsystems*, vol. 1, No. 1, pp. 7-12, Apr. 2002.

Lin, B.J., "The Paths to Subhalf-Micrometer Optical Lithography", SPIE vol. 922, Optical/Laser Microlithography (1988), pp. 256-269.

Matsuyama, T. et al., "Nikon Projection Lens Update", SPIE Microlithography 2004, 5377-65, Mar. 2004.

Nikon Precision Europe GmbH, "Investor Relations—Nikon's Real Solutions", May 15, 2003.

Owa, S. et al., "Advantage and Feasibility of Immersion Lithography", Proc. SPIE 5040 (2003).

Owa, S. et al., "Immersion Lithography; its potential performance and issues", SPIE Microlithography 2003, 5040-186, Feb. 27, 2003.

Owa, S. et a., "Potential Performance and Feasibility of Immersion Lithography", NGL Workshop 2003, Jul. 10, 2003.

Owa, S. et al., "Update on 193nm Immersion Exposure Tool", Litho Forum, International SEMATECH, Los Angeles, Jan. 27-29, 2004.

Owen, G. et at, "1/8μm Optical Lithography", J. Vac. Sci. Technol. B., vol. 10, No. 6, Nov./Dec. 1992, pp. 3032-3036.

Smith, B.W. et al., "Immersion Optical Lithography at 193nm", Future Fab International, vol. 15, Jul. 11, 2003.

Stevens, G.W.W., "Reduction of Waste Resulting from Mask Defects", Solid State Technology, Aug. 1978, vol. 21 008, pp. 68-72.

Suzuki, A., "Lithography Advances on Multiple Fronts", EEdesign, EE Times, Jan. 5, 2004.

Switkes, M. et al., "Immersion Lithography at 157 nm", J. Vac. Sci. Technol. B., vol. 19, No. 6, Nov./Dec. 2001, pp. 2353-2356.

Switkes, M. et al., "Immersion Lithography at 157 nm", MIT Lincoln Lab, Orlando 2001-1, Dec. 17, 2001.

Switkes, M. et al., "Immersion Lithography: Optics for the 50 nm Node", 157 Anvers-1, Sep. 4, 2002.

English Translation Abstract of JP 10255319 A.

English Translation Abstract of JP 4305915 A.

English Translation Abstract of SU 302685 A.

Search Report for Singapore Appln. No. 200403822-0, issued Nov. 28, 2004, 5 pages.

Examination Report issued for European Patent Appln. No. 04014393.5, dated Sep. 5, 2006, 6 pages.

Examination Report issued for European Patent Appln. No. 04014393.5, dated Jun. 9, 2008, 6 pages.

Notice of Preliminary Rejection issued for Korean Patent Appln. No. 10-2004-0048066, dated Feb. 22, 2006, 2 pages.

English Translation of the Notification of the First Office Action issued for Chinese Patent Appln. No. 200410060062.8, dated Jan. 20, 2006, 4 pages.

English Translation of the Notification of Second Office Action issued for Chinese Patent Appln. No. 200410060062.8, dated Aug. 25, 2006, 3 pages.

Written Opinion issued for Singapore Patent Appln. No. 200403822-0, dated Dec. 15, 2006, 3 pages.

Examination Report issued for Singapore Patent Appln. No. 200403822-0, dated Jul. 4, 2008, 4 pages.

English Translation of Notice of Reasons for Rejection issued for Japanese Patent Appln. No. 2004-188523, dated May 20, 2008, 3 pages.

Non-Final Office Action issued for U.S. Appl. No. 11/600,763, dated Sept. 26, 2008.

Final Office Action issued for U.S. Appl. No. 11/600,763, dated Jun. 15, 2009.

Non-Final Office Action issued for U.S. Appl. No. 11/600,763, dated Nov. 3, 2009.

Final Office Action issued for U.S. Appl. No. 11/600,763, dated Jun. 24, 2010.

* cited by examiner

IMMERSION PHOTOLITHOGRAPHY SYSTEM AND METHOD USING INVERTED WAFER-PROJECTION OPTICS INTERFACE

CROSS-REFERENCE TO RELATED APPLICATIONS

This application is a Continuation of application Ser. No. 10/831,300, filed Apr. 26, 2004, now U.S. Pat. No. 6,980,277 that issued Dec. 27, 2005, titled IMMERSION PHOTOLITHOGRAPHY SYSTEM AND METHOD USING INVERTED WAFER-PROJECTION OPTICS INTERFACE, which is a Continuation of application Ser. No. 10/607,170, filed Jun. 27, 2003, now U.S. Pat. No. 6,809,794 that issued Oct. 26, 2004, titled IMMERSION PHOTOLITHOGRAPHY SYSTEM AND METHOD USING INVERTED WAFER-PROJECTION OPTICS INTERFACE, each of which is incorporated by reference herein.

BACKGROUND OF THE INVENTION

1. Field of the Invention

The present invention relates to liquid immersion photolithography, and more particularly, to a method and system for confining liquid flow in an immersion photolithographic system.

2. Description of the Related Art

Optical lithography, using lens systems and catadioptric systems, is used extensively in the semiconductor manufacturing industry for the printing of circuit patterns. To date, the gap between a final lens element and a semiconductor wafer surface has been filled with gas, usually air or nitrogen. This gaseous gap works well particularly when the wafer is scanned under the optics during exposure and there is relative movement between the wafer and the lens system during the image transfer.

The practical limits of optical lithography assume that the medium through which imaging is occurring is air. This practical limit is defined by the equation $$\Lambda = \frac{\lambda}{4 \cdot n \cdot NA}$$

, where 8 is the wavelength of incident light, NA is numerical aperture of the projection optical system, and n is the index of refraction of the medium (where 4 is used instead of 2 due to the use of off axis illumination). The gas interface between the final lens element and the wafer surface limits the maximum resolution of the optical system to a numerical aperture of <1.0. If the gas space between the final lens element and the wafer surface can be filled with a refractive material, such as oil or water, then the numerical aperture, and hence the resolution capability, of the system can be significantly increased, corresponding to the index of refraction n.

Thus, by introducing a liquid between a last lens element of the projection optical system and a wafer being imaged, the refractive index changes, thereby enabling enhanced resolution with a lower effective wavelength of the light source. Immersion lithography effectively lowers a 157 nm light source to a 115 nm wavelength (for example, for n=1.365), enabling the printing of critical layers with the same photolithographic tools that the industry is accustomed to using today.

Similarly, immersion lithography can push 193 nm lithography down to, for example, 145 nm (for n=1.33). 435 nm, 405 nm, 365 nm, 248 nm, 193 nm and 157 nm tools can all be used to achieve effectively better resolution and "extend" the usable wavelengths. Also, large amounts of $CaF_2$, hard pellicles, a nitrogen purge, etc.—can be avoided. Also, depth of focus can be increased by the use of liquid immersion, which may be useful, for example, for LCD panel manufacturing.

However, despite the promise of immersion photolithography, a number of problems remain, which have so far precluded commercialization of immersion photolithographic systems. One problem of existing immersion photolithographic systems involves the difficulties of confining the liquid that is used in an interface between the projection optical system and the wafer being exposed. In conventional systems, liquid is injected between the projection optical system and the wafer. Fairly complex systems have been proposed in order to maintain the confinement of the liquid.

An additional problem exists where the scanning motion of the wafer is such that the wafer is moved away from the exposure area, resulting in a spilling of the liquid. Such spillage is also a problem even when the wafer is present under the projection optical system due to the inherent viscosity properties of the liquid.

Accordingly, what is needed is a simple system and method for confining the liquid between the projection optical system and the wafer.

SUMMARY OF THE INVENTION

The present invention is directed to an immersion photolithography system and method using an inverted wafer-projection optics interface that substantially obviates one or more of the problems and disadvantages of the related art.

There is provided a liquid immersion photolithography system including an exposure system that exposes a substrate with electromagnetic radiation, and also includes a projection optical system that focuses the electromagnetic radiation on the substrate. A liquid supply system provides a liquid between the projection optical system and the substrate. The projection optical system is positioned below the substrate.

In another aspect there is provided a liquid immersion photolithography system that includes an exposure system that exposes a substrate with electromagnetic radiation, and also includes a projection optical system that focuses the electromagnetic radiation on the substrate. A means for providing a liquid is between the projection optical system and the substrate. The projection optical system is positioned below the substrate. A meniscus is formed between the projection optical system and the wafer.

In another aspect there is provided a method of exposing a substrate including positioning a projection optical system below the substrate, projecting electromagnetic radiation onto the substrate using a projection optical system, and delivering a liquid between the projection optical system and the substrate.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

The present invention allows a space between a final lens element of a projection optical system and a wafer surface to be filled with a liquid. It allows a significant increase in the effective numerical aperture of the optical system. The volume of liquid is contained and held in position using a combination of pressure control on the liquid and gravity. The projection optical system (exposure system) is inverted compared to conventional systems currently in use. In other words, conventional systems expose downward or to the side, while the projection optical system of the present invention exposes upwards. The wafer is exposed with its resist-coated surface down, and the resist is in contact with a liquid meniscus. During wafer scanning, the meniscus traverses the resist-coated surface of the wafer.

The present invention allows the gap-filling liquid to be held in place even while the edge of the wafer is passed over the optics. The housing of the projection optical system, with the liquid, can be scanned off the edge of the wafer and rescanned onto the wafer while maintaining the liquid interface. Catch basins around the housing catch and contain any liquid displaced. The liquid meniscus is controlled by liquid pressure. This interface is thus easily compatible with many types of liquid.

Figure 1:
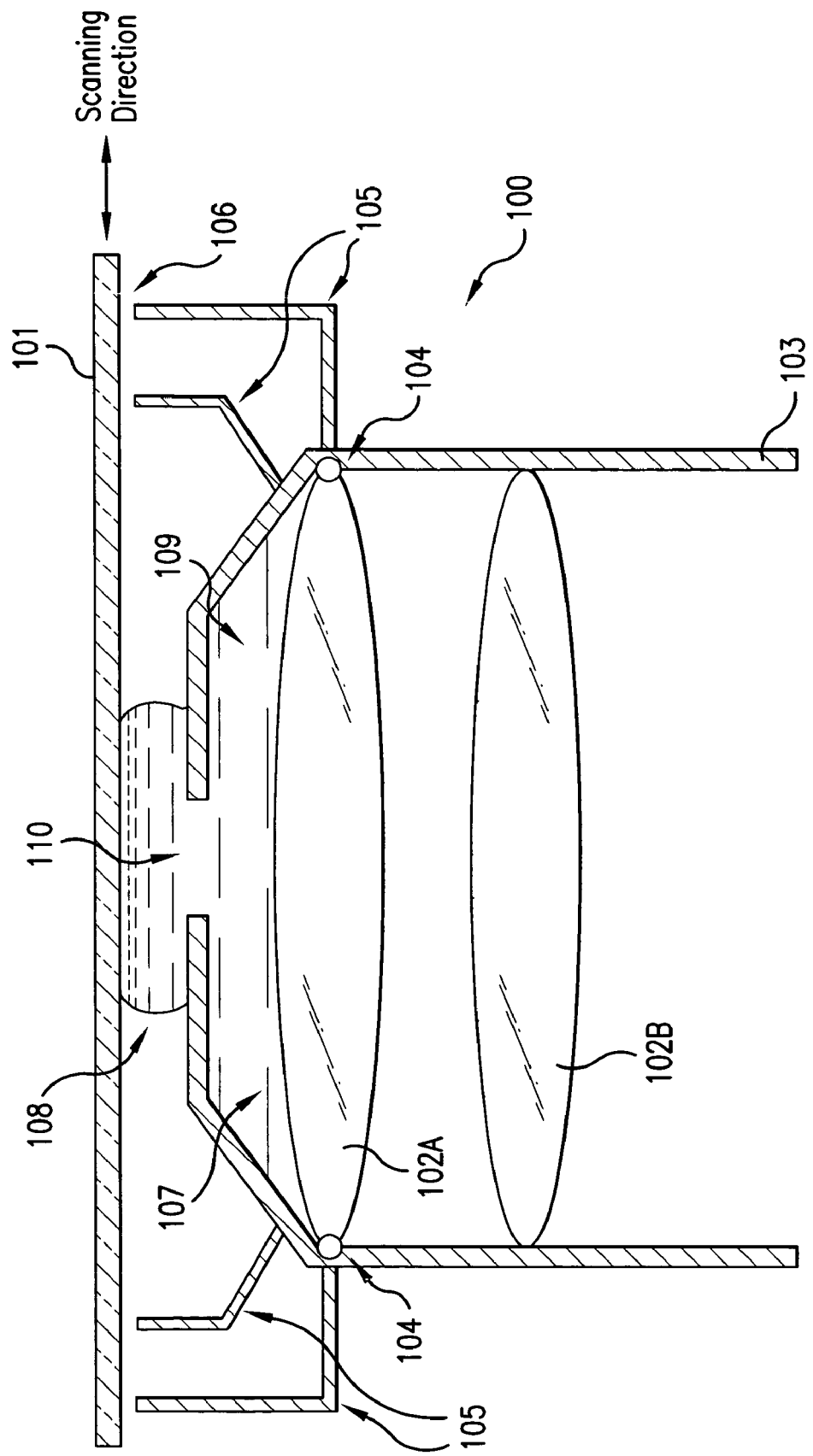
FIG. 1 shows a cross-sectional view of a liquid immersion photolithography system according to one embodiment of the present invention.

FIG. 1 illustrates an embodiment of a liquid immersion photolithographic system according to the present invention. As shown in FIG. 1, a projection optical system 100 is placed below a wafer 101. The wafer 101 includes resist-coated wafer surface 106. The projection optical system 100 includes a plurality of lens elements 102A, 102B, etc. The lens elements 102A, 102B are mounted within a housing 103. The top of the housing 103 includes an opening 110 for projecting an image onto the wafer 101. The top of the housing 103 is shown as horizontal in FIG. 1, although that need not necessarily be the case.

The region between the top of the housing 103 and the lens 102A (designated 107 in FIG. 1) is pressure controlled, and is sealed from the rest of the projection optics 100 by a liquid seal 104. The region 107 is filled with a liquid, normally under pressure from a liquid source (not shown in FIG. 1) so as to counterbalance the force of gravity. During exposure, the liquid forms a meniscus 108, as shown in FIG. 1. Catch basins 105 are used to remove any stray liquid, which may occur as the wafer 101 is scanned along a horizontal axis. It will be appreciated that more or fewer catch basins (compared to what is shown in FIG. 1) may be used. The catch basins 105 may also be annular around the housing 103.

Note that in the present invention, gravity is allowed to do the work of confining the liquid. The meniscus 108 is essentially controlled by gravity, while the wafer 101 is scanned. Furthermore, when the wafer 101 moves beyond the projection optics 100, the liquid will not readily spill over the edge of the wafer 101, unlike in conventional immersion photolithographic systems.

A liquid enclosing collar system (i.e., the catch basin 105) is attached to the end of the lithographic systems lens. As noted above, the projection optical system 100 exposes the image upwards onto the underside of the wafer 101 (i.e., wafer surface 106). The wafer 101 is resist coated, and the wafer surface 106 to be imaged is the lower surface. The top of the housing 103 provides a liquid interface between the final lens element 102A and the wafer surface 106 of the wafer 101 on which the projection optical system 100 is focused. The opening 110 in the top of the housing 103 allows the light beam from the projection optics 100 to be imaged on the wafer surface 106. It also allows intimate contact between the liquid and the wafer surface 106. It is important to ensure that the enclosed region 107 remains full of liquid, despite the top of the housing 103 being open to the wafer surface 106 and despite the wafer 101 potentially moving in an unrestricted manner above the projection optical system 100. The liquid is held in place by control of the pressure exerted on the liquid through a recirculation system (i.e., a liquid supply system, not shown in the figures). The pressure is controlled to balance gravity and maintain the meniscus 108 across the opening 110 when the wafer 101 is not present. When the wafer 101 is slid over the projection optical system 100, the pressure is increased to allow the liquid to "push out" of the aperture and contact the wafer surface 106. When the liquid interface slides over the edge of the wafer 101 due to the motion of the wafer 101 relative to the projection optics 100, the pressure on the liquid is adjusted to "pull back" the liquid from the wafer surface 106 into the region 107.

The top of the housing 103 near the aperture 110, shown in FIG. 1, may be specially contoured and surface finished to control the shape and properties of the interface liquid. For example, the surface of the top of the housing 103 may be made hydrophobic. The catch basins 105 surrounding the top of the housing 103 restrain the liquid that overflows or leaks from the top of the housing 103. This liquid can be filtered, temperature controlled and recycled back into the region 107.

Conditioning of the wafer surface 106 and the top of the housing 103 can further improve the performance. In the case of the liquid being water, the surfaces can be made hydrophobic. The gap (distance) between the wafer surface 106 and the top of the housing 103 is optimized by the dynamics of wafer exposure. While the system is designed for dynamic exposure of wafers in a scanning system, it also can be used in a step-and-scan type exposure system.

In typical dry exposure systems, the gap between the lens 102A and the wafer 101 is on the order of 3-4 millimeters. In the present invention, the dimension of the gap between the housing 103 and the wafer 101 may be made as low as 50 microns, although larger or smaller dimensions, for example, up to half a millimeter for the gap between the housing 103 and the wafer 101, may also be used (nominally, 100 microns are expected to be in the typical range, although ranges of 50-150 microns, 40-200 microns, or even up to 1 mm, and even in some cases greater than 1 mm, may be possible). It should be noted that water is the preferred liquid for 193 nanometer lithography, which is relatively lossless at 193 nm. For 157 nanometer lithography, losses within the liquid are a concern, which tends to require smaller gaps between the lens 102A and the wafer 101. In other words, the lens 102A would move closer to the wafer 101 (down to about 1 mm or so). In the case of 157 nm lithography, the gap between the housing 103 and the wafer 101 may be down to 50 microns or less.

It will also be appreciated that in the present invention, the liquid may be removed completely, in the event that exposure of the wafer 101 calls for a dry exposure. For dry exposure, the optics needs to be adjusted accordingly (e.g., focus, spherical aberration, reduction in the numerical aperture, etc.)

As noted above, for 193 nm imaging, the liquid is preferably water (e.g., de-ionized water), although other liquids, for example, cyclo-octane, Krytox® (Foemblin oil) and perfluoropolyelher fluids, may be used.

Figure 2:
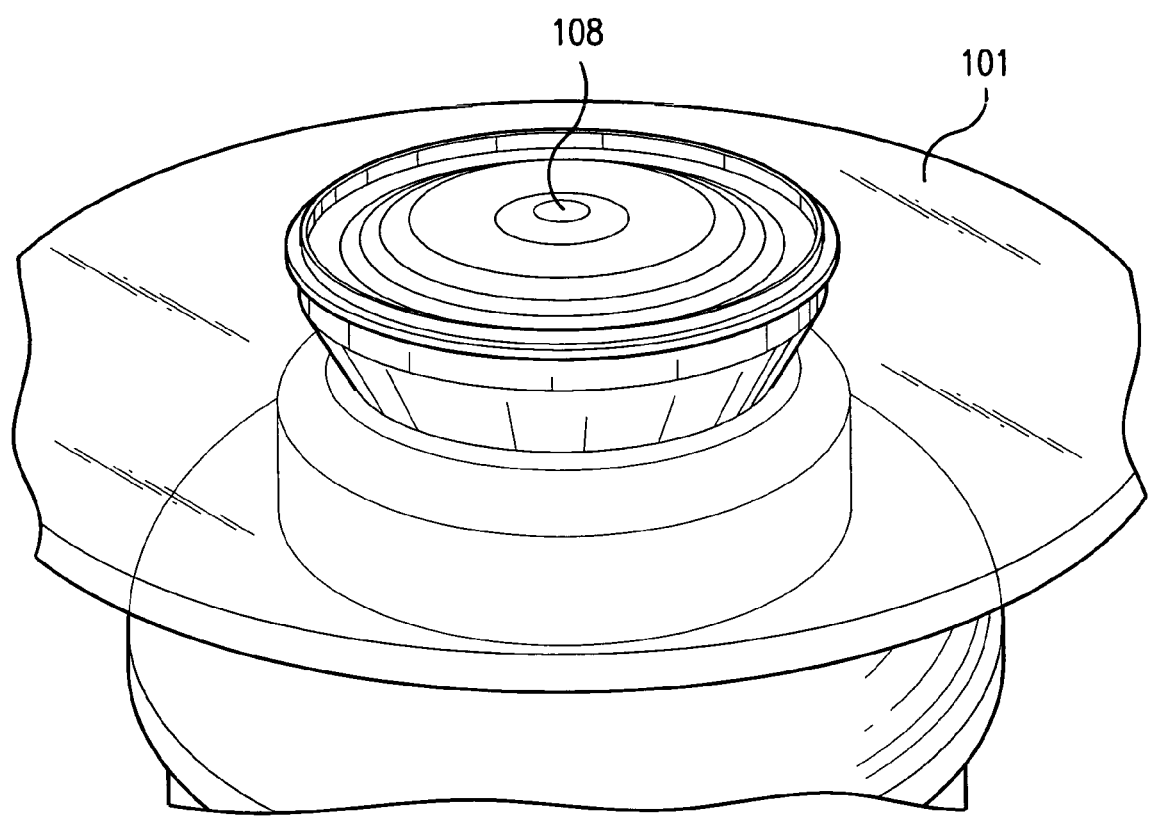
FIG. 2 shows an isometric view of the system of FIG. 1.

FIG. 2 illustrates an isometric view of the liquid immersion photolithographic system of FIG. 1. In FIG. 2, common elements with FIG. 1 have been labeled identically. (Note that in this simulated figure, the wafer 101 appears transparent.)

Placing of the projection optical system 100 below the wafer 101, rather than above it, permits taking advantage of gravity to form a meniscus 108 such that the confinement of the liquid is substantially simplified. This removes the need for complicated confinement systems, fairly complex liquid recirculation and pumping mechanisms, etc. It also considerably simplifies the effects of any stray liquid that can be simply captured using the catch basins 105.

As an alternative, it is possible to have "fountainhead" effect, where the liquid is expelled from the housing 103 towards the wafer 101, achieving a similar effect as that of the meniscus, and then flows in the catch basins for recycling.

The present invention results in a number of benefits to a liquid immersion photolithographic system. Confinement of the liquid is simplified.

Spillage is reduced or eliminated entirely. The system may be used both as a wet exposure system (with the liquid), and as a dry exposure system (without the liquid, with optics adjustes), as appropriate. All of these benefits allow the use of existing photolithographic tools and familiar wavelengths to define much smaller features on a semiconductor surface.

CONCLUSION

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks and method steps illustrating the performance of specified functions and relationships thereof. The boundaries of these functional building blocks and method steps have been arbitrarily defined herein for the convenience of the description. Alternate boundaries can be defined so long as the specified functions and relationships thereof are appropriately performed. Also, the order of method steps may be rearranged. Any such alternate boundaries are thus within the scope and spirit of the claimed invention. One skilled in the art will recognize that these functional building blocks can be implemented by discrete components, application specific integrated circuits, processors executing appropriate software and the like or any combination thereof. Thus, the breadth and scope of the present invention should not be limited by any of the above-described exemplary embodiments, but should be defined only in accordance with the following claims and their equivalents.

What is claimed is:

1. A liquid immersion photolithography system comprising:
    an optical system configured to image electromagnetic radiation upwards onto a substrate, the optical system comprising a housing; and
    an upper surface of the optical system capable of receiving a liquid, the liquid being received between the upper surface and, in use, the substrate,
    wherein a top of the housing has a hydrophobic surface to which, in use, the liquid comes into contact, and the liquid forms a meniscus above the top of the housing.

2. The liquid immersion photolithography system of claim 1, wherein the liquid forms the meniscus above the optical system.

3. The liquid immersion photolithography system of claim 1, wherein the liquid forms a fountainhead above the optical system.

4. The liquid immersion photolithography system of claim 1, wherein the housing includes at least one catch basin positioned to capture stray liquid.

5. The liquid immersion photolithography system of claim 1, wherein a plurality of lenses are mounted in the housing, the housing includes a pressure region between an uppermost lens of the plurality of lenses and the top of the housing and the housing has an opening in the top of the housing; and further comprising a liquid seal between an uppermost lens of the plurality of lenses and the pressure region.

6. The liquid immersion photolithography system of claim 5, wherein a distance between the substrate and the top of the housing is approximately 50-150 microns.

7. The liquid immersion photolithography system of claim 5, wherein a distance between the substrate and the top of the housing is between 50 microns and 500 microns.

8. A liquid immersion photolithography system comprising:
    an optical system adapted for exposure of a lower surface of a substrate, the optical system comprising a housing; and
    an upper surface of the optical system capable of receiving a liquid to form a meniscus between the optical system and, in use, the lower surface of the substrate,
    wherein a top of the housing has a hydrophobic surface to which, in use, the liquid comes into contact, and the liquid forms the meniscus above the top of the housing.

9. The liquid immersion photolithography system of claim 8, wherein the housing includes least one catch basin adapted to capture stray liquid.

10. The liquid immersion photolithography system of claim 8, wherein a plurality of lenses are mounted in the housing, the housing includes a pressure region between an uppermost lens of the plurality of lenses and the top of the housing and the housing has an opening in the top of the housing; and further comprising a liquid seal between an uppermost lens of the plurality of lenses and the pressure region.

11. The liquid immersion photolithography system of claim 10, wherein the liquid is adapted to selectively be provided only when wet exposure is needed.

12. A liquid immersion photolithography system, comprising:
    an exposure system including a projection optical system configured to focus electromagnetic radiation onto a substrate;
    a liquid supply system configured to provide a liquid between the projection optical system and, in use, the substrate; and a housing configured to provide a liquid interface between a final lens element of the projection optical system and the substrate, wherein a surface of the housing is hydrophobic and comes into contact, in use, with the liquid, and the liquid forms a meniscus above the housing.

13. The photolithography system of claim 12, wherein a top surface of the housing is hydrophobic.

14. The photolithography system of claim 12, wherein the housing comprises at least one catch basin positioned to capture stray liquid.

15. The photolithography system of claim 12, wherein the housing comprises a pressure region between the final lens element of the projection optical system and a top surface of the housing.

16. The photolithography system of claim 12, wherein the liquid supply system is further configured to selectively provide the liquid only when wet exposure is needed.

17. The photolithography system of claim 12, wherein the liquid forms a meniscus above the optical system.

18. The photolithography system of claim 12, wherein the liquid forms a fountainhead above the optical system.

* * * * *